(12) United States Patent
Granlund et al.

(10) Patent No.: US 8,508,225 B2
(45) Date of Patent: Aug. 13, 2013

(54) T2-WEIGHTED AND DIFFUSION-WEIGHTED IMAGING USING FAST ACQUISITION WITH DOUBLE ECHO (FADE)

(75) Inventors: Kristin L Granlund, Menlo Park, CA (US); Ernesto Staroswiecki, Menlo Park, CA (US); Brian A. Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 249 days.

(21) Appl. No.: 12/927,213

(22) Filed: Nov. 10, 2010

(65) Prior Publication Data

US 2012/0112743 A1    May 10, 2012

(51) Int. Cl.
G01R 33/48 (2006.01)
(52) U.S. Cl.
USPC .......................................... 324/309; 324/307
(58) Field of Classification Search
USPC ................................ 324/307, 309
See application file for complete search history.

(56) References Cited

U.S. PATENT DOCUMENTS

| 6,239,597 | B1 * | 5/2001 | McKinnon | 324/307 |
| 6,856,134 | B1 * | 2/2005 | Pelc et al. | 324/309 |
| 2007/0167732 | A1 * | 7/2007 | Zwanger | 600/410 |
| 2010/0102815 | A1 * | 4/2010 | Parker et al. | 324/309 |

FOREIGN PATENT DOCUMENTS

WO    WO 2008122056 A2 * 10/2008

* cited by examiner

*Primary Examiner* — Melissa Koval
*Assistant Examiner* — Rishi Patel
(74) *Attorney, Agent, or Firm* — Lumen Patent Firm

(57) ABSTRACT

A method of acquiring T2-weighted and diffusion-weighted images is provided. The method includes acquiring a first image and a second image in a single magnetic resonance imaging (MRI) scan, where the first image and the second image have different echo times (TE). The single MRI scan includes a series of repeated RF excitation pulses, where the echo signal for the first image and the echo signal for the second image are acquired between a pair of RF excitation pulses. A spoiler gradient is disposed to provide a first diffusion weighting to the first image and a second diffusion weighting to the second image, where the first image and the second image have different T2 weightings and different diffusion weightings.

17 Claims, 6 Drawing Sheets

T2-WEIGHTED AND DIFFUSION-WEIGHTED IMAGING USING FAST ACQUISITION WITH DOUBLE ECHO (FADE)

STATEMENT OF GOVERNMENT SPONSORED SUPPORT

This invention was made with Government support under contracts EB002524, EB009055, and RR009784 awarded by National Institutes of Health. The Government has certain rights in this invention.

FIELD OF THE INVENTION

The invention relates to magnetic resonance imaging. More particularly, the invention relates to obtaining high-resolution, three-dimensional T2-weighted and diffusion-weighted images.

BACKGROUND OF THE INVENTION

High-resolution 3D imaging is useful for improving the specificity of breast MRI since morphological characteristics, such as spiculations and heterogeneity, vary with histology. The specificity of breast MRI can be further improved by considering physiological information such as diffusion. Unlike T1-weighted contrast-enhanced imaging, it is difficult to acquire high-resolution T2- and diffusion-weighed images in reasonable scan times due to SNR and SAR limitations.

Steady-state free precession (SSFP) is a broad class of sequences in which the same RF pulse and gradient pulses are played each TR. After several repetitions, the magnetization reaches a steady state, i.e., the longitudinal and transverse magnetization are the same at the beginning of each TR. If the imaging gradients are not fully rewound, the sequence is referred to as non-balanced SSFP. For non-balanced sequences, a gradient echo signal is formed immediately following the RF pulse (the SSFP-FID signal) and another echo is formed immediately before the RF pulse (the SSFP-Echo signal). Depending on the imaging gradients used, either one or both echoes can be acquired during a single scan.

T2-weighted images are typically acquired using a spin-echo sequence with large TE and TR values to avoid T1 contamination. By acquiring images with multiple different echo times, the T2 value can be mapped on a pixel-by-pixel basis. Because fluids appear bright on T2-weighted scans, they are useful for highlighting edema and other fluid. T2-weighted imaging is commonly used in clinical scans, including evaluating cartilage health and distinguishing breast tumors from cysts.

Diffusion-weighted imaging (DWI) is sensitive to molecular motion; diffusion gradients cause moving spins to be dephased, which results in signal loss relative to stationary spins. DWI typically uses a spin-echo EPI (echo-planar imaging) acquisition. The sequence includes a slice-selective excitation followed by diffusion gradients centered around a refocusing pulse followed by an EPI acquisition. Diffusion-weighted imaging is widely used for early evaluation of stroke and has also been used in tumor imaging.

A short TE and a long TR are desirable for DWI to minimize T1 and T2 weighting in the images. However, the time required to play the diffusion gradients can lengthen TE and cause T2 or T2* weighting in the images, which is known as T2 shine-through, and can affect the quantification of diffusion. Shine-through is typically avoided by acquiring images with a minimum of three different amounts of diffusion weighting (b-values).

RARE (rapid acquisition with relaxation enhancement) is commonly used for T2-weighted imaging. 3D RARE is used clinically because it is able to acquire T2-weighted images in reasonable scan times and is relatively insensitive to inhomogeneity. RARE sequences have high specific absorption rate (SAR) because repeated refocusing pulses are used to refocus the signal in order to acquire multiple lines per excitation. T2 decay between different echoes can result in blurring since different phase encodes have different weighting. In order to achieve T2 weighting, the edges of k-space are sampled before the center of k-space, resulting in some edge enhancement. Additionally, phase errors in k-space can lead to ghosting.

DWI typically uses a single-shot EPI acquisition. The sequences are often limited to smaller matrix sizes and can suffer from severe distortions due to field inhomogeneities and ghosting due to eddy currents.

What is needed is a method to obtain high-resolution three-dimensional T2 and diffusion-weighted images using steady-state sequence in short scan times and with low SAR.

SUMMARY OF THE INVENTION

A method of acquiring T2-weighted and diffusion-weighted images is provided. The method includes acquiring a first image and a second image in a single magnetic resonance imaging (MRI) scan, where the first image and the second image have different echo times (TE), and the single MRI scan includes a series of repeated RF excitation pulses, where the echo signal for the first image and the echo signal for the second image are acquired between one pair of the RF excitation pulses, where a spoiler gradient is disposed to provide a first diffusion weighting to the first image and a second diffusion weighting to the second image, where the first image and the second image have different T2 weightings and different diffusion weightings.

In one aspect of the invention, the spoiler gradient is a changeable spoiler gradient, where the changeable spoiler gradient includes a non-rewound component of an imaging gradient on all gradient axes.

According to another aspect of the invention, the spoiler gradient is a changeable spoiler gradient, where parameters of the changeable spoiler gradient include pulse duration, pulse amplitude, pulse position in time, pulse direction, or any combination thereof.

In a further aspect of the invention, a sequence timing is changed to modify the T2 weighting and the diffusion weighting of the first image and the second image, where the sequence timing changes include changing TE1, TE2, TR, or any combination thereof.

In yet another aspect of the invention, a flip angle of the RF excitation pulse is changed to modify the T2 weighting and to modify the diffusion weighting of the first image and the second image.

According to one aspect of the invention, the RF excitation pulse is changed to modify acquired information, where the change in the RF excitation pulse includes changing parameters that include spatial selectivity, spectral selectivity, off-resonance, playing the RF excitation pulse with adiabatic parameters, or any combination thereof.

In another aspect of the invention, data from the first image is used to correct data from the second image, where the correction of the second image data includes phase correction, motion correction, parallel imaging artifact correction, or any combination thereof.

In a further aspect of the invention, the MRI scan is repeated with the TE shifted, where the shifted TE enables a separation of water and fat in the images.

In another aspect of the invention, acquisition of each echo signal having the TE is replaced with multiple acquisitions of the echo signals, where the multiple acquisitions have different the TE, where the multiple echo signal acquisitions enable a separation of water from fat in the first image and the second image.

According to one embodiment of the invention, a method of acquiring T2-weighted and diffusion-weighted images is provided that includes acquiring a first image and a second image in a single magnetic resonance imaging (MRI) scan, where the first image and the second image have different echo times (TE), and the single MRI scan includes a series of repeated RF excitation pulses, where the echo signal for the first image and the echo signal for the second image are acquired between each pair of the RF excitation pulses, where a spoiler gradient is disposed to provide a first diffusion weighting to the first image and a second diffusion weighting to the second image, where the first image and the second image have different T2 weightings and different diffusion weightings, where the MRI scan is repeated with different sequence parameters.

According to one aspect of the current embodiment, the different sequence parameters include changing parameters that include spoiler pulse duration, spoiler pulse amplitude, spoiler pulse position, spoiler pulse direction, TE1, TE2, TR, flip angle of the RF excitation pulse, spatial selectivity of the RF pulse, spectral selectivity of the RF pulse, off-resonance of the RF pulse, disposing the RF excitation pulse with adiabatic properties, or any combination thereof.

In a further aspect of the current embodiment, the first image and the second image in each MRI scan are compared for differences in image contrast, where the differences in image contrast are used to quantify tissue parameters, where the tissue parameters include T1, T2, a proton density, or an apparent diffusion coefficient (ADC).

In yet another aspect of the current embodiment, the first image and the second image in each MRI scan are compared for differences in image contrast, where the differences in image contrast are used to quantify system parameters, where the system parameters include B0, B1 or off-resonance.

According to another aspect of the current embodiment, a T2 map is calculated from the images, where the T2 map is corrected to remove the effects of diffusion.

In yet another aspect of the current embodiment, an apparent diffusion coefficient (ADC) map is calculated from the images, where the ADC map is corrected to remove the effects of diffusion.

According to one aspect of the current embodiment, images from the MRI scans are combined using arithmetic operations to provide hybrid image contrast.

In a further aspect of the current embodiment, each spoiler gradient for each the MRI scan is disposed in a different direction, where directional diffusion information is provided, where the directional diffusion is used to calculate diffusion tensor information.

DETAILED DESCRIPTION

The current invention provides a method to obtain high-resolution three-dimensional T2- and diffusion-weighted images. By using a steady-state sequence, these images are acquired in short scan times with low specific absorption rate (SAR) and low image distortion.

The fast acquisition double echo (FADE) sequence was originally designed to provide T2 contrast. Others have used SSFP-Echo images (alone) acquired with different spoiler areas to evaluate diffusion. The method according to the current invention achieves both results with one fast sequence by modifying the echo times and the spoiler gradient areas. It also allows correction of each calculation (T2 and apparent diffusion coefficient) for the effects of the other parameter.

T2-weighted and diffusion-weighted imaging are widely used in clinical MRI. High-resolution images with T2 or diffusion contrast are challenging due to the use of echo trains (both spin echo and EPI) and due to SAR limitations. In this invention, the FADE sequence is used, which is also known as double echo in the steady state (DESS), to rapidly provide high-resolution 3D T2-weighted and diffusion-weighted images.

Figure 1:
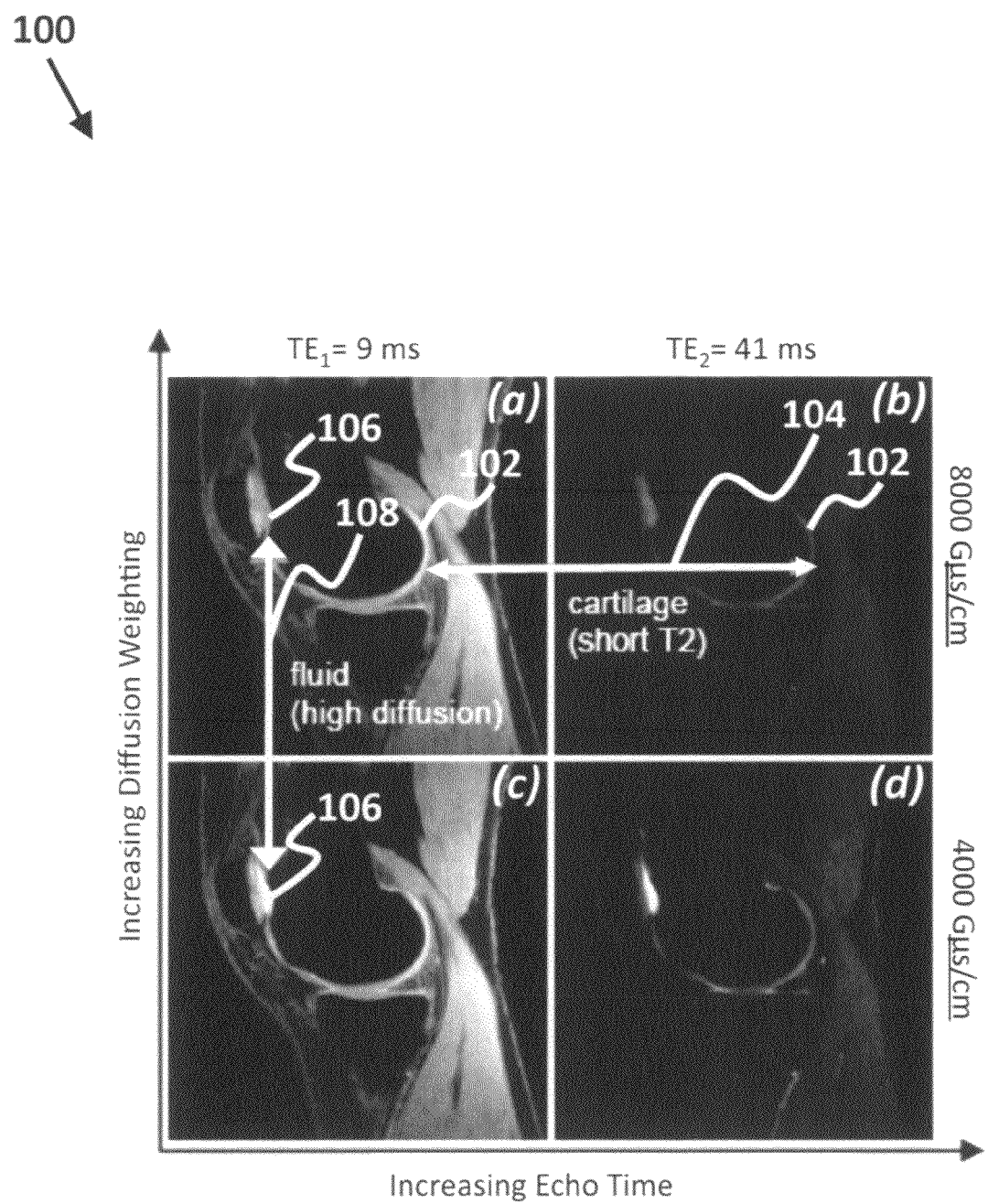
FIGS. 1a-1d show knee images acquired using fast acquisition double echo (FADE), according to one embodiment of the invention.

By acquiring two images with different echo times, images with different T2 weightings are generated in a single scan, and by varying the area and direction of the spoiler gradients, diffusion weighting can be varied. The present invention acquires both echoes using two separate readout gradients. Species with shorter T2 values (such as muscle and cartilage) appear darker when the echo time is longer (FIG. 1, small arrow 104) and regions of high diffusivity (such as the synovial fluid in the suprapatellar bursa) have lower signal when the gradient area is larger (FIG. 1, large arrow 108).

FIGS. 1a-1d show knee images 100 acquired using FADE. Shown are different T2 weightings (FIGS. 1a and 1c vs. FIGS. 1b and 1d) and different diffusion weightings (FIGS. 1a and 1b vs. FIGS. 1c and 1d). The signal in the fluid 106 behind the patella, which has unrestricted motion and long T2, is attenuated by increasing the spoiler gradient areas, as indicated with the large arrow 108. The signal in the cartilage 102, which has a short T2 and low diffusion, is attenuated by increasing the echo time, as indicated with the small arrow 104. The images were acquired with a 3:49 scan time, 0.4× 0.6×3.0 mm³ resolution, and 14×14×11 cm³ field of view.

The method of the current invention includes acquiring a first image and a second image in a single magnetic resonance imaging (MRI) scan, where the first image and the second image have different echo times (TE). The single MRI scan includes a series of repeated RF excitation pulses, where the echo signal for the first image and the echo signal for the second image are acquired between each pair of RF excitation pulses. A spoiler gradient is disposed to provide a first diffusion weighting to the first image and a second diffusion weighting to the second image, where the first image and the second image have different T2 weightings and different diffusion weightings.

The invention acquires fast, 3D, high-resolution T2 weighted and diffusion weighted images, which can be used to generate quantitative T2 maps that are corrected to remove the effects of diffusion and to generate quantitative apparent diffusion coefficient (ADC) maps that are corrected to remove the effects of T2.

FADE (also known as DESS and MENSA) is a sequence having repeated RF pulses with unbalanced imaging gradients. In one embodiment of the invention, the spoiler gradient is located midway between the readout gradient pulses and echoes are formed both before and after the spoiler gradients (see FIG. 2). The effective spoiler area on each axis is equal to the unbalanced component of the gradients, or the zeroth moment of each gradient axis.

Figure 2:
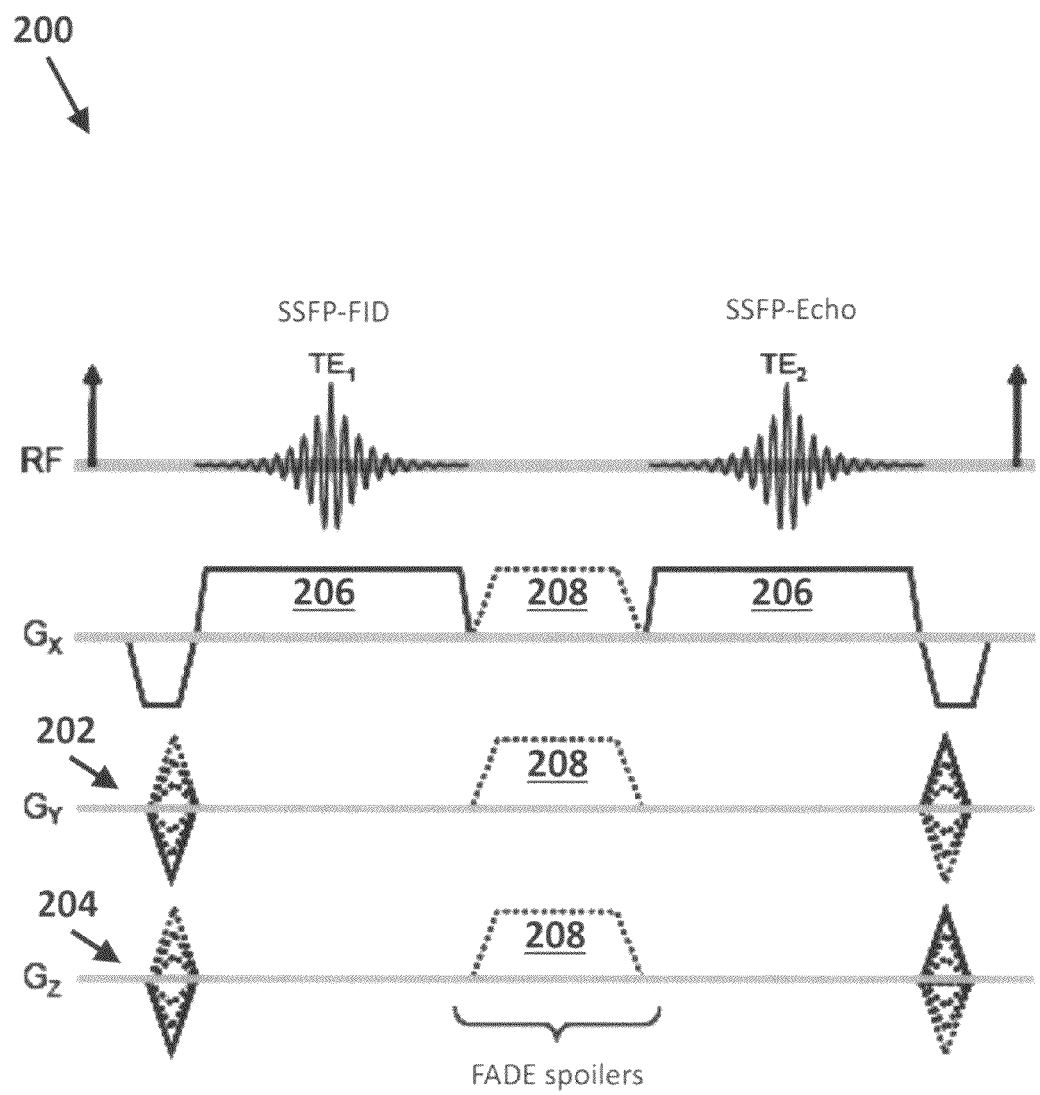
FIG. 2 shows a FADE sequence diagram, according to one embodiment of the invention.

FIG. 2 shows a FADE sequence diagram 200. Two echoes are acquired during each TR corresponding to the same phase encode (GY) 202 and slice encode (GZ) 204. The two readout gradients (GX) 206 are separated by the spoiler gradients 208, which can be played on any combination of axes. Because the T2 and diffusion weightings are coupled, any change to the sequence parameters changes both the T2 and the diffusion weighting.

The effect is to provide an SSFP-FID or S+ echo (identical to the signal of GRASS, FFE, GRE or FISP) and an SSFP-Echo or S− echo (often called CE-FAST, T2-FFE or PSIF). Quantitative analysis of the diffusion signal contrast is complicated, requiring knowledge of TE, TR, flip angle, spoiler gradient amplitude, spoiler gradient duration, spoiler gradient position, T1, T2, and spin density. Depending on the assumptions made, the shape of the curve may vary. In addition, these sequences are often quite sensitive to motion.

The key to this technique is that two echoes are acquired fairly robustly with FADE, which can provide both T2 weighted and diffusion weighted images using a 3D acquisition that does not suffer from distortion or long echo times. The time between echoes and the size of the spoiler gradients can be completely controlled, which allows adjustment in the amount of T2 and diffusion weighting. During post-processing, the images are combined to improve quantitative results by removing diffusion effects from T2 maps and removing T2 shine-through from ADC maps. Furthermore, the sequence has relatively low SAR because it uses small flip angles. The sequence timing is changed to modify the T2 weighting and the diffusion weighting of the first image and the second image, where the changed timing includes changing TE1, TE2, TR, or any combination thereof.

Further, the spoiler gradient is a changeable spoiler gradient that includes a non-rewound component of an imaging gradient on all gradient axes. The parameters of the changeable spoiler gradient include pulse duration, pulse amplitude, pulse position, or any combination thereof.

In an exemplary simulation, Bloch equations were used to simulate the effects of the sequence parameters on the echo signals. The magnetization was simulated for 100 TRs. Steady state was reached after approximately 30 repetitions, so the signal was calculated as the average signal of the last 70 TRs.

Figure 3:
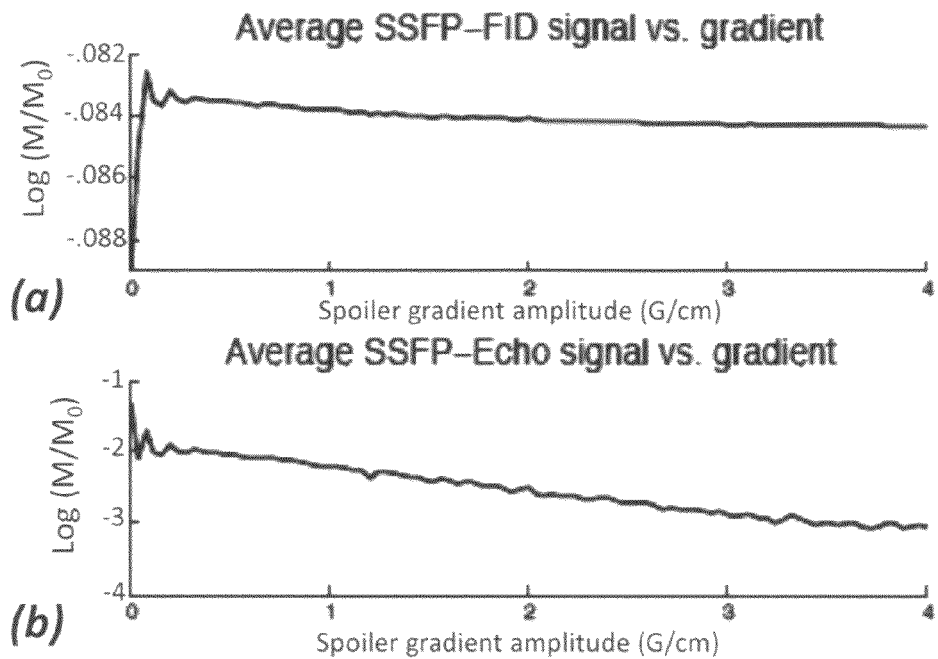
FIGS. 3a-3b show the results of a Bloch simulation, according to the current invention.

Some gradient area is necessary to generate the second echo (SSFP-Echo) and avoid the banding artifact, as evidenced by the oscillations in signal intensity for small gradient amplitudes (see FIG. 3b). Although the signal appears to have a linear relationship beyond that minimum, it is actually more complicated (it is dependent on TE, TR, flip angle, T1, T2, proton density, spoiler gradient amplitude, spoiler gradient duration, spoiler gradient position, and D). FIGS. 3a-3b show the results of a Bloch simulation including diffusion for 4000 spins. The gradient was varied while the diffusion coefficient was maintained at $2 \times 10^{-3}$ mm$^2$/s and the tissue parameters used correspond to cartilage. The plots show SSFP-FID and SSFP-Echo signals that were averaged over the steady-state TRs for various spoiler gradient amplitudes.

According to the invention, the flip angle of the RF excitation pulse can be changed to modify the T2 weighting and to modify the diffusion weighting of the first image and the second image.

Figure 4:
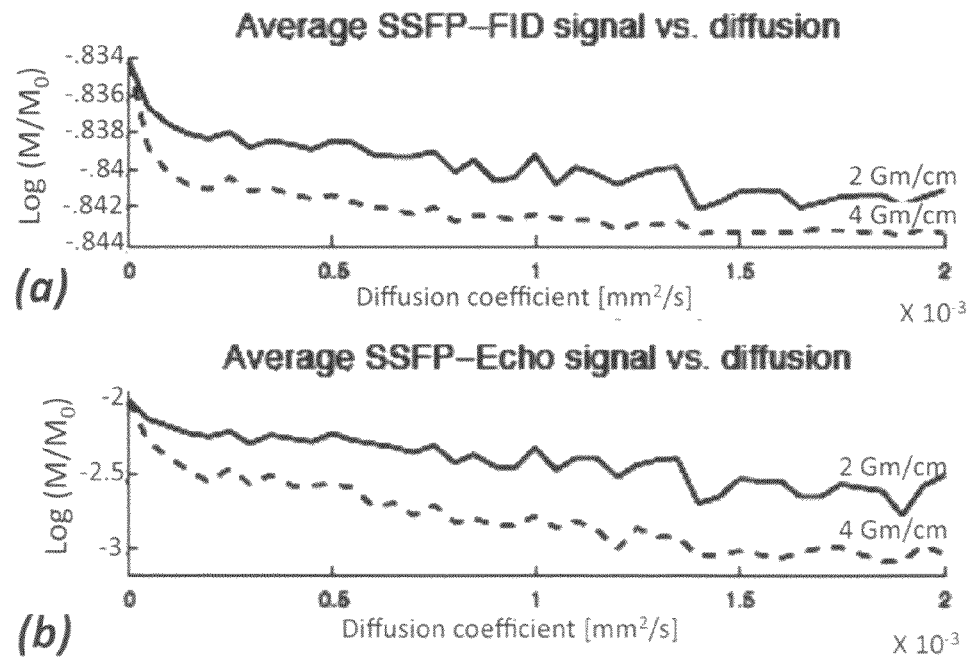
FIGS. 4a-4b show the signal intensities versus diffusion coefficient, according to the current invention.

FIGS. 4a-4b show the signal intensities versus diffusion coefficient. The signal intensity is also a complicated function of tissue and sequence parameters, but there is clearly a diffusion weighting between the SSFP-FID and SSFP-Echo images and for different spoiler gradient areas. The results of the Bloch simulation included diffusion for 4000 spins. The diffusion coefficient was varied while the spoiler gradient area was maintained at 2 G/cm (solid line) and 4 G/cm (dashed line) and the tissue parameters used correspond to cartilage. The plots show SSFP-FID and SSFP-Echo signals that were averaged over the steady-state TRs for various diffusion coefficients. There is a different diffusion sensitivity for different spoiler amplitudes. The diffusion sensitivity of the SSFP-Echo is stronger than that of the SSFP-FID signal (note different scales). By acquiring images with different spoiler areas, the effects of T2 and diffusion can be separated.

Diffusion is the bulk effect of the random motion of molecules. When averaged over a large number of spins, a smooth change in signal intensity is expected as the diffusion coefficient increases, but simulating a physically realistic number of isochromats would require prohibitively long simulation times. The simulated 4000 spins are sufficient to reveal the general trend.

The tissue parameters used in the simulations correspond to cartilage at 3 T: T1=800 ms, T2=40 ms, D=$2 \times 10^{-5}$ cm$^2$/s. These parameters do not result in much diffusion sensitivity in the SSFP-FID signal. The cartilage parameters correspond most closely to agar, which does not demonstrate much diffusion sensitivity in the SSFP-FID signal, as shown in FIGS. 5a-5b.

According to the invention, the RF excitation pulse is changed to modify acquired information, where the change in the RF excitation pulse includes changing parameters that include spatial selectivity, spectral selectivity, off-resonance, playing the RF excitation pulse with adiabatic properties or any combination thereof. Further, the MRI scan can be repeated with shifted TE that enables a separation of water and fat in the images. In another aspect of the invention, acquisition of each echo signal having TE is replaced with multiple acquisitions of the echo signals, where the multiple acquisitions have different TE, where the multiple echo signal acquisitions enable a separation of water from fat in the first image and the second image.

Figure 5:
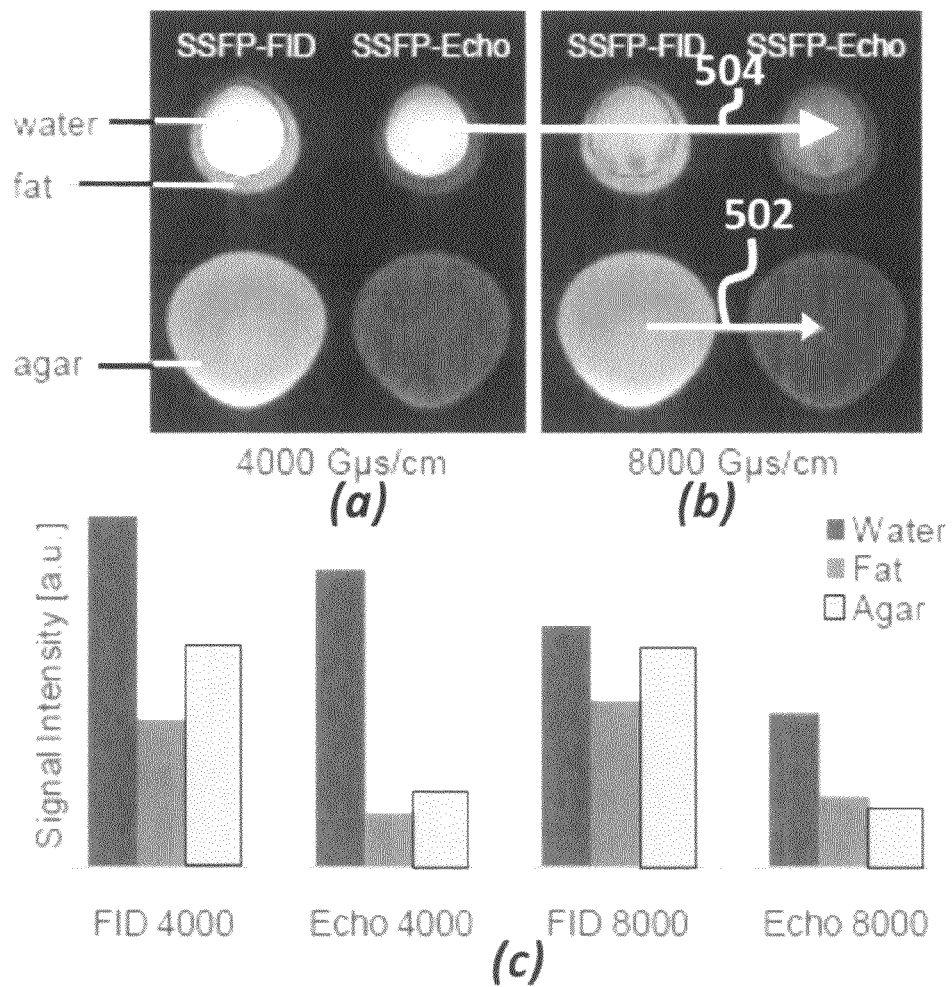
FIGS. 5a-5c show images of water, fat and agar and the corresponding signal intensities using the methods of the current invention.

An exemplary phantom experiment 500 is provided here and shown in FIGS. 5a-5c, where the technique is tested using an agar gel phantom and a breast phantom having a water phantom inside a peanut oil phantom. The gel and oil phantoms have low diffusivity and short T2; water has high diffusivity and a long T2. The phantoms were scanned using the FADE sequence with two different spoiler gradient areas.

Contrast differences are clearly visible in the acquired images; all shown with the same window and level in FIGS. 5a and 5b. The fat and agar phantoms appear much darker in the SSFP-Echo images than in the SSFP-FID images (small arrow 502) due to the short T2 of each phantom and the long TE of the second echo. The water signal of each echo is much smaller for a larger spoiler gradient area (large arrow 504) since the increased gradient area causes greater dephasing of moving spins (i.e., regions with greater diffusion).

To show how the signal intensity varies with echo time and spoiler area, the average signal intensity is plotted for each phantom (see FIG. 5c). The signal in the second echo is lower for all species and both spoiler gradient areas, but the decrease is more significant for short T2 species (fat and agar). When the FADE spoiler area increases, the diffusion weighting increases. Therefore, more attenuation of the signal is seen in areas of higher diffusion (water) than in regions with restricted diffusion (fat and agar) between the two acquisitions. The phantom scans confirm that the FADE sequence is sensitive to both T2 and diffusion. The phantom images were acquired using FADE with two different spoiler areas showing the effects of T2 and diffusion: signal decreases in the oil and gel between the two echoes are due to short T2 values and decreased signal in the water between the two acquisitions is due to greater diffusion. The T2 sensitivity is shown by the signal decreases between the SSFP-FID and SSFP-Echo images, and is most significant for short T2 species (fat and agar). The diffusion sensitivity is shown by the signal decreases as the spoiler area increases. This sensitivity is strongest for the water signal, due to the relatively unrestricted movement of spins within the phantom.

The sequence was tested on more than ten breast volunteers and more than ten knee volunteers. It is confirmed that FADE provides T2 and diffusion weighting in human subjects (see FIG. 1).

Figure 6:
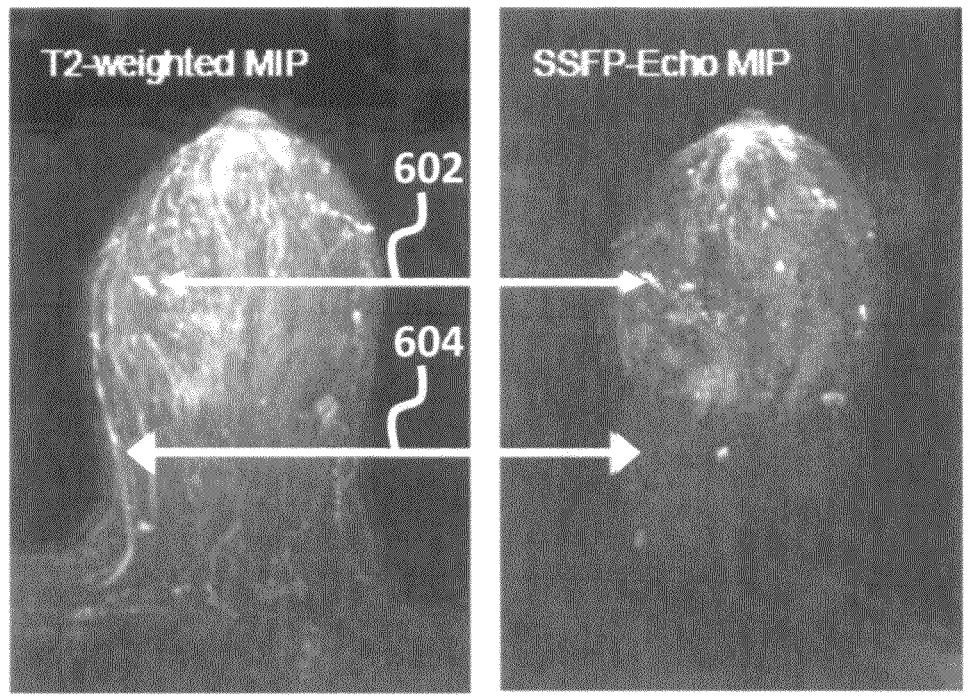
FIGS. 6a-6b show maximum intensity projection (MIP) images through 50 mm of breast tissue using the methods of the current invention.

The sequence has been used to scan eight patients with suspected tumors. Presented are scans of two patients with breast tumors (confirmed by biopsy) using the FADE sequence prior to contrast injection. FIGS. 6a-6b show maximum intensity projection (MIP) images 600 through 50 mm of breast tissue. The SSFP-Echo image from the FADE acquisition (8000 Gμs/cm spoiler in the L/R direction) shows similar contrast to the diagnostic T2-weighted scan: bright features on the T2-weighted MIP also appear bright on the SSFP-Echo MIP, such as lymph nodes and cysts (small arrow 602). The image from the FADE acquisition (FIG. 6b) has higher contrast and higher resolution than the diagnostic image (FIG. 6a). It is also interesting to note that blood vessels, which are visible in the diagnostic image, are absent from the FADE image (large arrow 604), possibly due to flow. The T2-weighted images were acquired with a 4:12 scan time, 1.1×1.3×6 0 mm$^3$ resolution, and 34×34×13 cm$^3$ field of view. The FADE images were acquired with a 2:41 scan time, 0.8×1.2×3.0 mm$^3$ resolution, and 30×30×12 cm$^3$ field of view.

Figure 7:
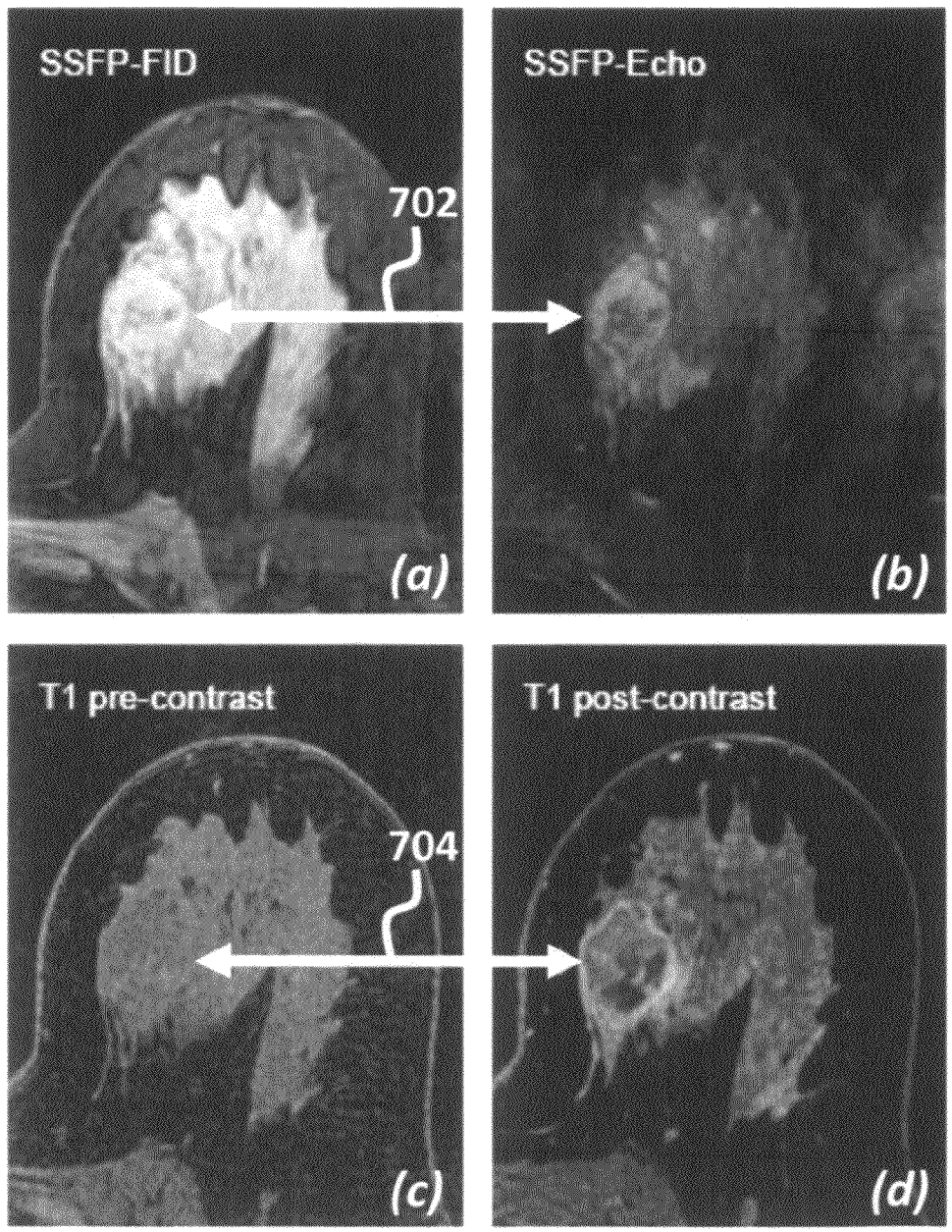
FIGS. 7a-7d show a single slice through a tumor using a FADE acquisition with a spoiler gradient area of 8000 Gμs/cm in the L/R direction, using the methods of the current invention.

FIGS. 7a-7d show a single slice 700 through a tumor using a FADE acquisition with a spoiler gradient area of 8000 Gμs/cm in the L/R direction. There is a clear contrast difference between the normal glandular tissue and the tumor between the two echoes (arrow 702 of FIGS. 7a and 7b). Tumors typically have higher cellular density than healthy tissue resulting in reduced diffusion. This may explain why less signal decrease is seen in the tumor than in the glandular tissue. Also shown are the high-resolution T1-weighted pre- and post-contrast images from the clinical scan (FIGS. 7c and 7d). The tumor, which is not easily distinguished from glandular tissue in the pre-contrast image, demonstrates early enhancement in the post-contrast image. The arrow 704 shows a comparison between the tumors in pre- and post-contrast T1-weighted images. The contrast between tumor and glandular tissue is clearly seen in FIGS. 7b and 7d, where the contrast is evident within a single image, as opposed to between the images. The tumor is not clearly visible on the pre-contrast image of FIG. 7c but shows early enhancement on the post-contrast image of FIG. 7d. The FADE images were acquired with a 3:35 scan time, 0.9×1.3×5.0 mm$^3$ resolution, and 34×34×14 cm$^3$ field of view. The T1-weighted images were acquired with a 4:45 scan time, 0.6×1.2×1.0 mm$^3$ resolution, and 33×33×16 cm$^3$ field of view.

This technique uses a robust sequence to acquire two echoes. In addition to an image with T2 and diffusion weighting (SSFP-Echo signal), a high-SNR image can be acquired with T2/T1 contrast (SSFP-FID signal). This high-SNR image can be used as an anatomical reference image or as a reference for improving image reconstruction.

Short TRs are required to minimize the SSFP banding artifacts, since signal nulls occur when the off-resonance is equal 1/TR. The spoiler gradients of the double echo sequence used here allow a longer TR to be used without producing banding artifacts, thus allowing a wider range of possible sequence parameters. This is particularly useful at higher field strengths, where field inhomogeneities are more significant. Longer TRs also allow for using 1-2-1, water-only, or spatial-spectral excitation pulses for fat suppression.

Diffusion-weighted imaging is sensitive to motion since the random motion of water is encoded with the spoiler gradients; any other motion (e.g., bulk or physiological motion) can be encoded as diffusion and result in erroneous ADC measurements. Because the method of the current invention acquires two images, the SSFP-FID data can be used to correct the SSFP-Echo, where the correction includes phase correction, motion correction, parallel imaging artifact correction, or any combination thereof. The corrected data can allow more accurate quantification of tissue and system parameters, where the tissue parameters include T1, T2, proton density, and apparent diffusion coefficient and the system parameters include B0, B1, and off-resonance.

Advantages of this technique include the ability to do fast 3D imaging with isotropic resolution or thin slices, the avoidance of artifacts from echo trains or EPI trains, such as blurring, distortion, or variable fat suppression, and the ability to simultaneously map T2 and diffusion coefficient in just two acquisitions. Further advantages include the use of small flip angles, which reduce SAR, which is a limitation at 3T and higher field strengths, the acquisition of two echoes, where the first echo could be used as a reference without affecting the signal of the second echo, flexibility to easily combine with any image acceleration technique without concern for phase ordering, and the possibility of imaging cancers without the use of a contrast agent.

Until now, T2 weighted and diffusion weighted imaging have been challenging due to long imaging times and the use of echo trains. By using a steady-state acquisition according to the current invention, one is able to simultaneously acquire T2-weighted and diffusion-weighted images in reasonable scan times. Furthermore, the weighting can be modified by varying the acquisition parameters.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example varying the flip angle to generate different diffusion weighting without significantly affecting the T2 contrast. Further variations include the ability to incorporate fat suppression using a water-only excitation pulse, fat saturation, multi-echo acquisition (e.g., Dixon method), etc, acquiring diffusion information in three dimensions for diffusion tensor imaging (DTI). Additionally, use of other fast trajectories, like spiral or EPI, to acquire the signals, and use of parallel imaging to further reduce the acquisition time are possible. One is able to calibrate B1 and the effects of T1 to provide quantitative T2 and ADC values, and varying the RF pulses to additionally modulate the magnetization transfer (MT) effect.

All such variations are considered to be within the scope and spirit of the present invention as defined by the following claims and their legal equivalents.

What is claimed:

1. A method of acquiring T2-weighted and diffusion-weighted images, comprising: acquiring a first image and a second image in a single magnetic resonance imaging (MRI) scan, wherein said first image and said second image are separated by a spoiler gradient, wherein said single MRI scan comprises a series of repeated RF excitation pulses, wherein an echo signal for said first image and an echo signal for said second image are acquired between one pair of said RF excitation pulses, wherein said spoiler gradient is disposed to provide a first diffusion weighting to said first image and a second diffusion weighting to said second image, wherein said MRI scan is repeated with different said spoiler gradients, wherein each said spoiler gradient is used to apply a different said diffusion weighting to each said image, wherein each said image has a unique said T2 weighting and a unique said diffusion weighting.

2. The method of claim 1, wherein said spoiler gradient is a changeable spoiler gradient, wherein said changeable spoiler gradient comprises a non-rewound component of an imaging gradient on all gradient axes.

3. The method of claim 1, wherein said spoiler gradient is a changeable spoiler gradient, wherein parameters of said changeable spoiler gradient comprises parameters selected from the group consisting of a pulse duration, a pulse amplitude, a pulse position in time, and a pulse direction.

4. The method of claim 1, wherein a sequence timing is changed to modify said T2 weighting and said diffusion weighting of said first image and said second image, wherein said sequence timing changes comprises changing parameters selected from the group consisting of TE1, TE2, and TR.

5. The method of claim 1, wherein a flip angle of an RF excitation pulse in said series of repeated RF excitation pulses is changed to modify said T2 weighting and to modify said diffusion weighting of said first image and said second image.

6. The method of claim 1, wherein an RF excitation pulse in said series of repeated RF excitation pulses is changed to modify acquired information, wherein said change in said RF excitation pulse comprises changing parameters selected from the group consisting of spatial selectivity, spectral selectivity, off-resonance, and playing said RF excitation pulse with adiabatic parameters.

7. The method of claim 1, wherein data from said first image is used to correct data from said second image, wherein said correction of said second image data comprises data selected from the group consisting of phase correction, motion correction and parallel image artifact correction.

8. The method of claim 1, wherein said MRI scan is repeated with said TE of said first image or said TE of said second image shifted, wherein each said shifted TE enables a separation of water and fat in said images.

9. The method of claim 1, wherein an acquisition of each echo signal having said TE is replaced with multiple acquisitions of said echo signals, wherein said multiple acquisitions have different said TE, wherein said multiple echo signal acquisitions enable a separation of water from fat in said first image and said second image.

10. A method of acquiring T2-weighted and diffusion-weighted images, comprising: acquiring a first T2 image and a second T2 image in a single magnetic resonance imaging (MRI) scan, wherein said first T2 image and said second T2 image have different echo times (TE), wherein said single MRI scan comprises a series of repeated RF excitation pulses, wherein an echo signal for said first image and an echo signal for said second T2 image are acquired between each pair of said RF excitation pulses, wherein a spoiler gradient is disposed to provide a first diffusion weighting to said first T2 image and a second diffusion weighting to said second image, wherein said first T2 image and said second T2 image have different T2 weightings and different diffusion weightings, wherein said MRI scan is repeated with different sequence parameters.

11. The method of claim 10, wherein said different sequence parameters comprise changing parameters selected from the group consisting of spoiler pulse duration, spoiler pulse amplitude, spoiler pulse position, spoiler pulse direction, TE1, TE2, TR, flip angle of said RF excitation pulse, spatial selectivity of said RF pulse, spectral selectivity of said RF pulse, off-resonance of said RF pulse, and disposing said RF excitation pulse with adiabatic properties.

12. The method of claim 10, wherein said first image and said second T2 image in each said MRI scan are compared for differences in image contrast, wherein said differences in image contrast are used to quantify tissue parameters, wherein said tissue parameters comprise T1, T2, a proton density, or an apparent diffusion coefficient (ADC).

13. The method of claim 10, wherein said first T2 image and said T2 second image in each said MRI scan are compared for differences in image contrast, wherein said differences in image contrast are used to quantify system parameters, wherein said system parameters comprise B0, B1 or off-resonance.

14. The method of claim 10, wherein a T2 map is calculated from said images, wherein said T2 map is corrected to remove effects of diffusion.

15. The method of claim 10, wherein an apparent diffusion coefficient (ADC) map is calculated from said images, wherein said ADC map is corrected to remove effects of T2.

16. The method of claim 10, wherein images from said MRI scans are combined using arithmetic operations to provide hybrid image contrast.

17. The method of claim 10, wherein each said spoiler gradient for each said MRI scan is disposed in a different direction, wherein directional diffusion information is provided, wherein said directional diffusion is used to calculate diffusion tensor information.

* * * * *